(12) United States Patent
Henry et al.

(10) Patent No.: US 8,506,307 B2
(45) Date of Patent: Aug. 13, 2013

(54) ELECTRICAL CONNECTOR WITH EMBEDDED SHELL LAYER

(75) Inventors: David Henry, Platte City, MO (US); Jiachun Zhou, Gilbert, AZ (US); Kanapathipillai Prabakaran, Queen Creek, AZ (US); Yingdong Ji, Suzhou (CN)

(73) Assignee: Interconnect Devices, Inc., Kansas City, KS (US)

( * ) Notice: Subject to any disclaimer, the term of this patent is extended or adjusted under 35 U.S.C. 154(b) by 133 days.

(21) Appl. No.: 12/959,038

(22) Filed: Dec. 2, 2010

(65) Prior Publication Data

US 2012/0142229 A1 Jun. 7, 2012

(51) Int. Cl.
*H01R 12/00* (2006.01)

(52) U.S. Cl.
USPC ............... 439/66; 439/482; 439/700

(58) Field of Classification Search
USPC .............. 439/65, 66, 482, 700, 824; 324/754
See application file for complete search history.

(56) References Cited

U.S. PATENT DOCUMENTS

| | | |
|---|---|---|
| 3,771,110 A | 11/1973 | Reed |
| 4,200,351 A | 4/1980 | Long et al. |
| 4,625,442 A | 12/1986 | Hill et al. |
| 4,773,877 A | 9/1988 | Krüger et al. |
| 4,783,624 A | 11/1988 | Sabin |
| 4,846,739 A | 7/1989 | Mawby |
| 4,885,533 A | 12/1989 | Coe |
| 4,936,842 A | 6/1990 | D'Amelio et al. |
| 5,009,613 A | 4/1991 | Langgard et al. |
| 5,175,493 A | 12/1992 | Langgard |
| 5,204,615 A | 4/1993 | Richards et al. |
| 5,225,773 A | 7/1993 | Richards |
| 5,484,306 A | 1/1996 | Mawby et al. |
| 5,667,410 A | 9/1997 | Johnston |
| 5,967,856 A | 10/1999 | Meller |
| 5,982,187 A | 11/1999 | Tarzwell |

(Continued)

FOREIGN PATENT DOCUMENTS

| | | |
|---|---|---|
| EP | 1 172 658 A2 | 1/2002 |
| JP | 2003-107130 | 4/2003 |

(Continued)

OTHER PUBLICATIONS

Connect2it, "Series 90 Pneumatic Contacts," available at http://www.connect2it.com/pdfs/pneumatic_contact.pdf, pp. 96-102, downloaded Nov. 12, 2008 (7 pages total).

(Continued)

*Primary Examiner* — Khiem Nguyen
(74) *Attorney, Agent, or Firm* — Finnegan, Henderson, Farabow, Garrett & Dunner LLP

(57) ABSTRACT

An electrical connector and method of forming the same are provided, where the method can include affixing at least one layer to a core such that the layer is isomorphic to at least a portion of on an external surface of the core, press fitting the core with the layer into a socket cavity in a socket body, and removing the core from the socket cavity while leaving at least a portion of the layer so that the layer forms a shell layer affixed to an internal surface of the socket cavity. The method can further include inserting at least one plunger and a biasing device into a shell cavity so that a tail of the plunger is slidably received in the shell cavity and the biasing device biases a tip of the plunger away from an internal surface of the shell cavity.

19 Claims, 7 Drawing Sheets

(56) References Cited

U.S. PATENT DOCUMENTS

| | | | |
|---|---|---|---|
| 6,046,597 | A | 4/2000 | Barabi |
| 6,070,997 | A | 6/2000 | Duke et al. |
| 6,104,205 | A | 8/2000 | Mawby |
| 6,208,155 | B1 | 3/2001 | Barabi et al. |
| 6,220,870 | B1 | 4/2001 | Barabi et al. |
| 6,297,654 | B1 | 10/2001 | Barabi |
| 6,323,667 | B1 | 11/2001 | Kazama |
| 6,398,592 | B1 | 6/2002 | Mori et al. |
| 6,424,166 | B1 | 7/2002 | Henry et al. |
| 6,471,524 | B1 | 10/2002 | Nakano et al. |
| 6,506,082 | B1 | 1/2003 | Meek et al. |
| 6,559,665 | B1 | 5/2003 | Barabi |
| 6,626,708 | B2 | 9/2003 | Phillips |
| 6,634,890 | B2 | 10/2003 | Peterson et al. |
| 6,696,850 | B1 | 2/2004 | Sanders |
| 6,703,855 | B1 | 3/2004 | Wu et al. |
| 6,758,682 | B1 | 7/2004 | Kosmala |
| 6,773,130 | B1 | 8/2004 | Richardson |
| 6,791,345 | B2 | 9/2004 | Maruyama et al. |
| 6,863,576 | B2 | 3/2005 | Campbell et al. |
| 7,008,270 | B1 | 3/2006 | Huh et al. |
| 7,052,297 | B2 | 5/2006 | Panzar et al. |
| 7,064,564 | B2 | 6/2006 | Kister et al. |
| 7,102,373 | B2 | 9/2006 | Yoshida |
| 7,148,713 | B1 | 12/2006 | Meek et al. |
| 7,154,286 | B1 | 12/2006 | Marx et al. |
| 7,249,661 | B2 | 7/2007 | Becocci et al. |
| 7,279,913 | B2 | 10/2007 | Wu et al. |
| 7,297,004 | B1 | 11/2007 | Shuhart et al. |
| 7,298,153 | B2 | 11/2007 | Farris et al. |
| 7,362,118 | B2 | 4/2008 | Henry et al. |
| 7,402,051 | B1 | 7/2008 | Batish et al. |
| 7,498,826 | B2 | 3/2009 | Bogatin et al. |
| 7,728,611 | B1 | 6/2010 | Kraynak |
| 7,798,867 | B2 | 9/2010 | Sanders |
| 2003/0042883 | A1 | 3/2003 | Thurston et al. |
| 2005/0184747 | A1 | 8/2005 | Sanders |
| 2006/0043988 | A1 | 3/2006 | Cram et al. |
| 2006/0125502 | A1 | 6/2006 | Lindsey et al. |
| 2006/0139042 | A1 | 6/2006 | Kasukabe |
| 2006/0250151 | A1 | 11/2006 | Cram et al. |
| 2006/0261828 | A1 | 11/2006 | Cram et al. |
| 2008/0061808 | A1 | 3/2008 | Mok et al. |
| 2008/0061809 | A1 | 3/2008 | Lee et al. |
| 2008/0100325 | A1 | 5/2008 | Sinclair |
| 2008/0143366 | A1 | 6/2008 | Kurotori et al. |
| 2008/0257027 | A1 | 10/2008 | Wu |
| 2009/0261851 | A1 | 10/2009 | Zhou et al. |

FOREIGN PATENT DOCUMENTS

| | | |
|---|---|---|
| JP | 2005-009927 | 1/2005 |
| WO | WO 03/090249 A2 | 10/2003 |
| WO | WO 2007/043977 A1 | 4/2007 |
| WO | WO 2010/027597 A2 | 3/2010 |

OTHER PUBLICATIONS

International Search Report and Written Opinion issued in PCT International Application No. PCT/US2011/062815, mailed Feb. 21, 2012 (13 pages total).

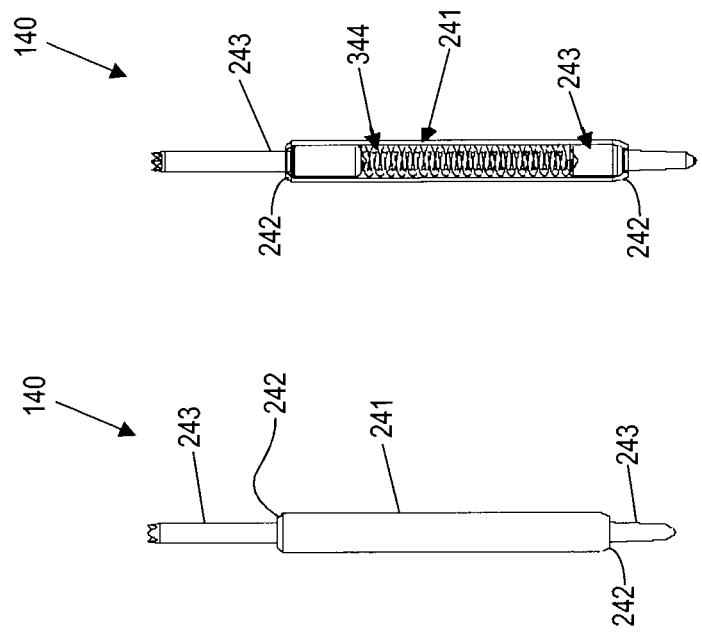
Fig. 3
Prior Art
Fig. 2
Prior Art
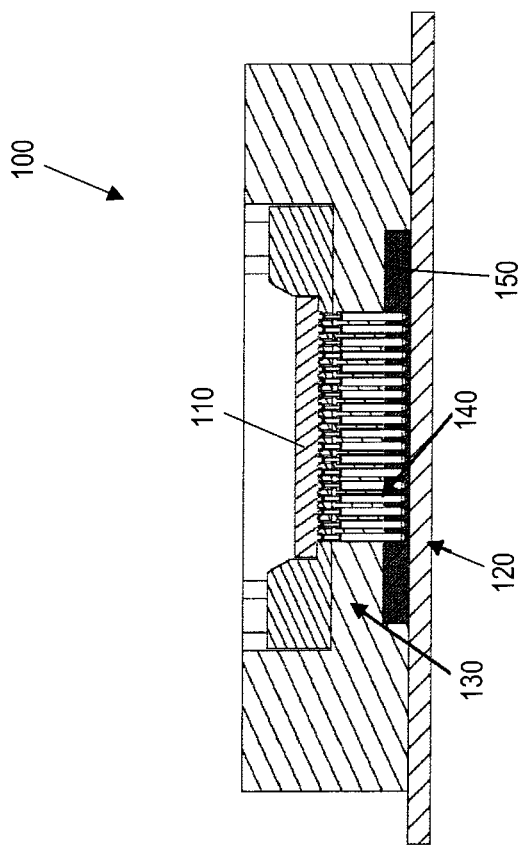
Fig. 1
Prior Art

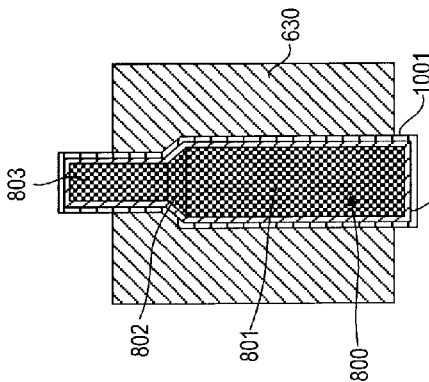
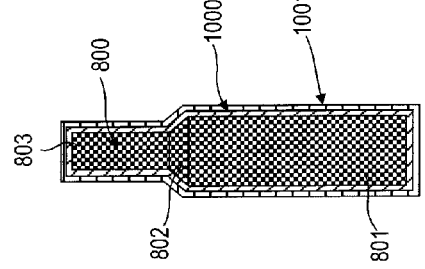
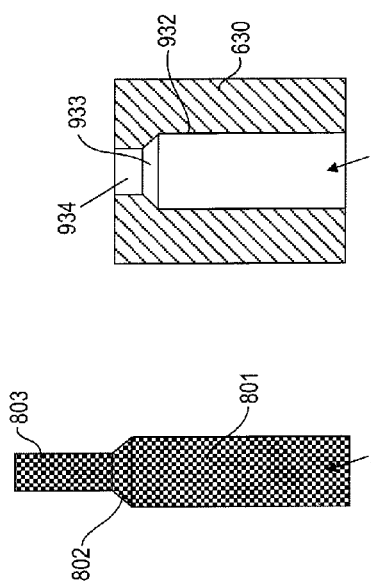
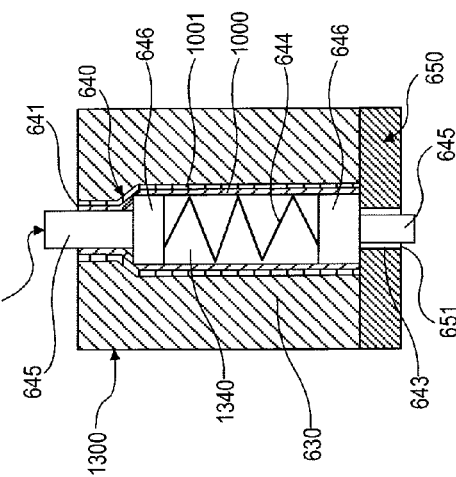
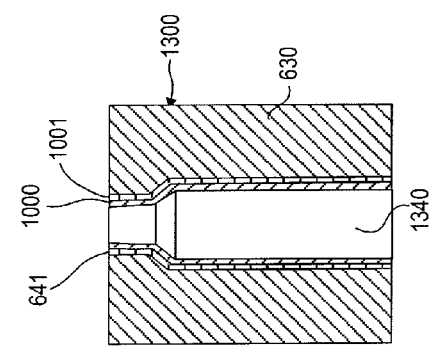
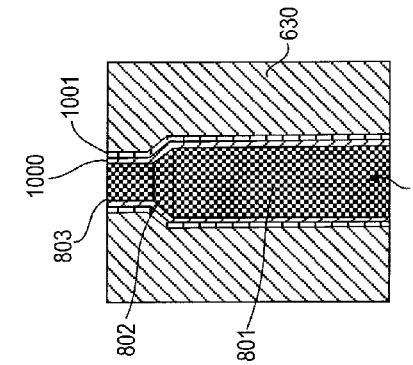

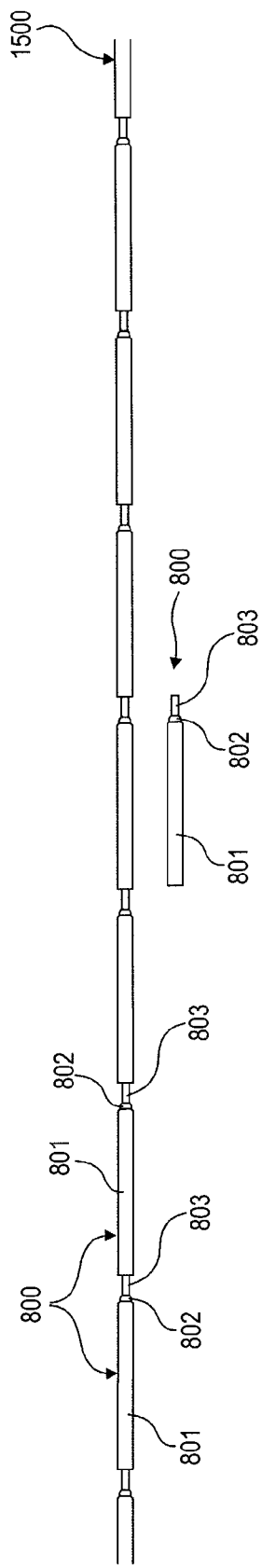

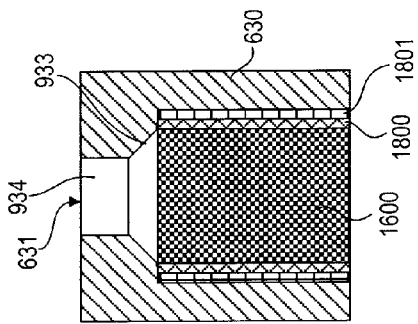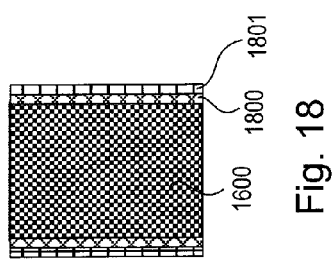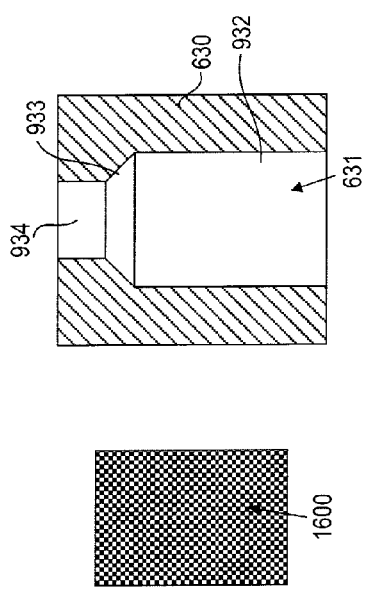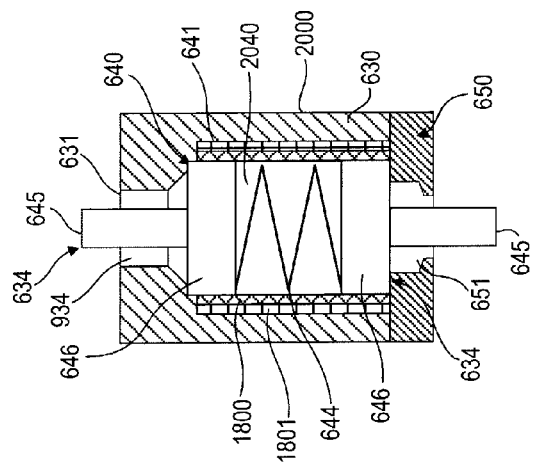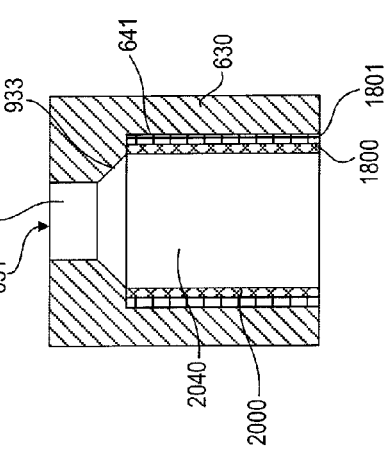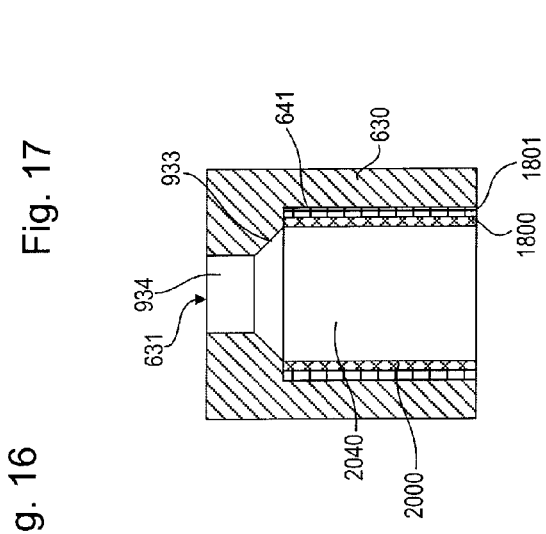

ELECTRICAL CONNECTOR WITH EMBEDDED SHELL LAYER

TECHNICAL FIELD

The present disclosure relates generally to an electrical connector, and more particularly, to materials, components, and methods directed to the fabrication and use of an electrical connector with an embedded shell layer.

BACKGROUND

In the electronics and semiconductor industries, systems used to test and qualify integrated circuit (IC) chips during the manufacturing process are conventionally referred to as "test systems." FIG. 1 depicts a test system 100. The test system 100 includes an electrical connector for providing an electrical connection between an IC chip 110 and a printed circuit board (PCB) 120. The electrical connector can include a socket body 130, a plurality of spring probes 140, and a socket retainer 150.

FIGS. 2 and 3 depict the spring probe 140. The spring probe 140 can include a shell 241, a pair of plungers 243, and a spring 344. The shell 241 can be tubular and can be formed of copper alloy coated by nickel and gold. The plungers 243 and the spring 344 can be slidable inside the shell 241. The shell 241 can be crimped at both ends 242 to retain the plungers 243 and the spring 344 within the shell 241, and the spring 344 can bias the plungers 243 outwardly from the shell 241. Thus, the spring 344 is capable of exerting a force against each plunger 243 outwardly from the shell 241, and also the plungers 243 can be depressed inwardly into the shell 241 under a force directed inward against the spring 344.

The spring probe 140 can be inserted through and held within corresponding cavities in a socket body 130 and a socket retainer 150 in an array. FIGS. 4 and 5 show the spring probe 140 inserted into socket cavities 431 formed in the socket body 130 and the socket retainer 150. The socket body 130 and the socket retainer 150 can position the plungers 243 of the spring probes 140 such that the plungers 243 at a first end of the spring probes 140 electrically connect to conductive pads on the IC chip 110, and the plungers 243 at a second end of the spring probes 140 electrically connect to conductive pads on the PCB 120.

In the test system 100, an external surface of the spring probe 140 is formed with a diameter that is smaller than the diameter of an internal surface of the socket cavity 431 to allow the spring probe 140 to be inserted into the socket cavity 431 in the socket body 130. As a result, as shown in FIG. 5, a first gap 560 can be formed between the internal surface of the socket cavity 431 and the external surface of the shell 241.

Also, in the test system 100, an external surface of the plunger 243 inside the shell 241 is formed with a diameter that is smaller than the diameter of an internal surface of the shell 241 to allow the plunger 243 to be inserted into the shell 241. As a result, as shown in FIG. 5, a second gap 570 can be formed between the internal surface of the shell 241 and the external surface of the plunger 243.

SUMMARY

In one aspect, the present disclosure is directed to a method of forming an electrical connector. The method can include affixing at least one layer to a core such that the at least one layer is isomorphic to at least a portion of on an external surface of the core and press fitting the core with the at least one layer into a socket cavity in a socket body where the socket cavity includes an internal surface. The method can also include removing the core from the socket cavity while leaving at least a portion of the layer so that the layer forms a shell layer affixed to the internal surface of the socket cavity where the shell layer further includes a shell cavity with an internal shell surface. The method can also include inserting at least one plunger and a biasing device into the shell cavity so that a tail of the at least one plunger is slidably received in the shell cavity and the biasing device biases a tip of the at least one plunger away from the internal surface of the shell cavity.

In another aspect, the present disclosure is directed to a method of forming an electrical connector. The method can include forming a shell layer in a socket cavity in a socket body such that the shell layer is secured inside the socket cavity by a press fit where the shell layer includes a shell cavity. The method can also include inserting at least one plunger and a biasing device into the shell cavity so that a tail of the at least one plunger is slidably received in the shell cavity and the biasing device biases a tip of the at least one plunger away from the shell cavity, and at least partially closing an open end of the shell cavity using a retainer to limit sliding movement of at least one of the at least one plunger and the biasing device in the shell cavity.

In a further aspect, the present disclosure is directed to an electrical connector. The electrical connector can include a socket shell comprising a body having a socket cavity with an internal socket surface extending through the body, and at least one shell layer having a shell cavity and an external shell surface isomorphic to at least a portion of the internal socket surface and affixed as a layer to at least the portion of the internal socket surface where the at least one shell layer can include a first shell material. The electrical connector can also include a contact probe including at least one plunger slidably received in the shell cavity and extending through a first opening in a first end of the shell cavity, and a biasing device configured to exert a biasing force on the at least one plunger.

Additional features and advantages will be set forth in part in the description which follows, being apparent from the description of or learned by practice of the disclosed embodiments. The features and advantages will be realized and attained by means of the elements and combinations particularly pointed out in the appended claims. It is to be understood that both the foregoing general description and the following detailed description are exemplary and explanatory only and are not restrictive of the scope of the embodiments, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

FIG. 1 is a cross-sectional view of a test system, including an electrical connector connecting an integrated circuit chip to a printed circuit board;

FIG. 2 is a side view of a spring probe of the electrical connector of FIG. 1;

FIG. 3 is a cross-sectional view of the spring probe of FIG. 2;

FIGS. 8-14 depict aspects of a method for forming an electrical connector, according to another exemplary embodiment, where:

FIG. 8 is a side view of a core used for forming the electrical connector,

FIG. 9 is a cross-sectional view of a socket body of the electrical connector,

FIG. 10 is a cross-sectional view of the core of FIG. 8 with a plurality of layers, FIGS. 11 and 12 are cross-sectional views of the core with the layers of FIG. 10 press fitted into the socket body of FIG. 9, FIG. 13 is a cross-sectional view of a socket shell formed by the core with the layers and the socket body of FIGS. 11 and 12, and FIG. 14 is a cross-sectional view of the electrical connector formed with the socket shell of FIG. 13;

FIG. 15 is a side view of a wire for forming the core of FIG. 8;

FIGS. 16-21 depict aspects of a method for forming an electrical connector, according to a further exemplary embodiment, where:

FIG. 16 is a side view of a core used for forming the electrical connector,

FIG. 17 is a cross-sectional view of a socket body of the electrical connector,

FIG. 18 is a cross-sectional view of the core of FIG. 16 with a plurality of layers, FIG. 19 is a cross-sectional view of the core with the layers of FIG. 18 press fitted into the socket body of FIG. 17, FIG. 20 is a cross-sectional view of a socket shell formed by the core with the layers and the socket body of FIG. 19, and FIG. 21 is a cross-sectional view of the electrical connector formed with the socket shell of FIG. 20.

DETAILED DESCRIPTION

Reference will now be made in detail to exemplary embodiments of the invention, examples of which are illustrated in the accompanying drawings. Wherever possible, the same reference numbers will be used throughout the drawings to refer to the same or like parts.

Figure 5:
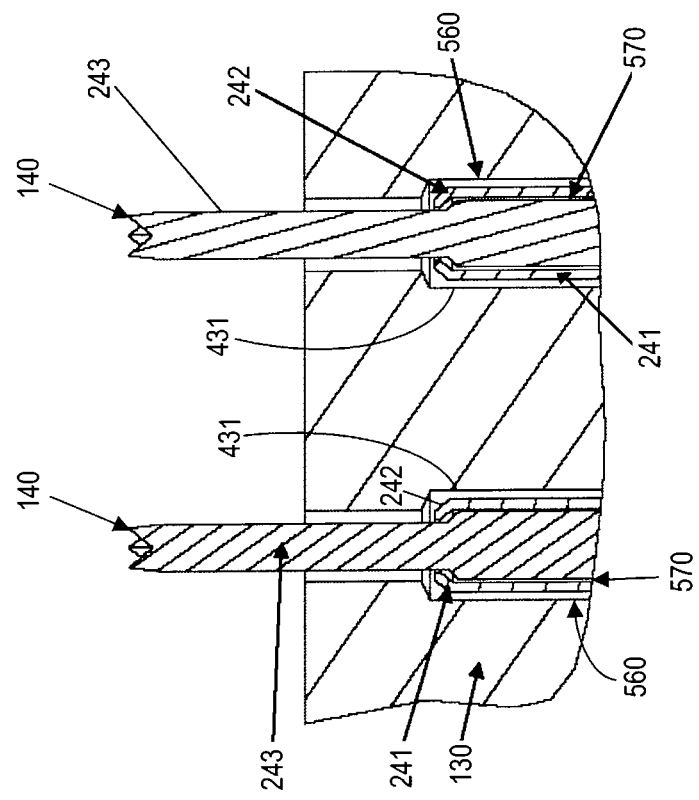
FIGS. 4 and 5 are cross-sectional views of the spring probe in the electrical connector of FIG. 1.
Figure 4:
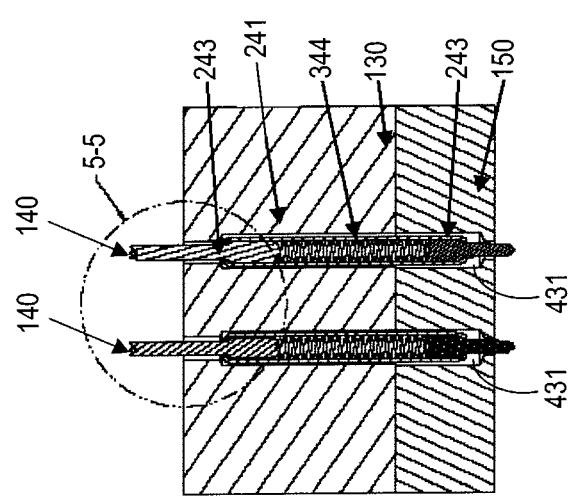
Figure 7:
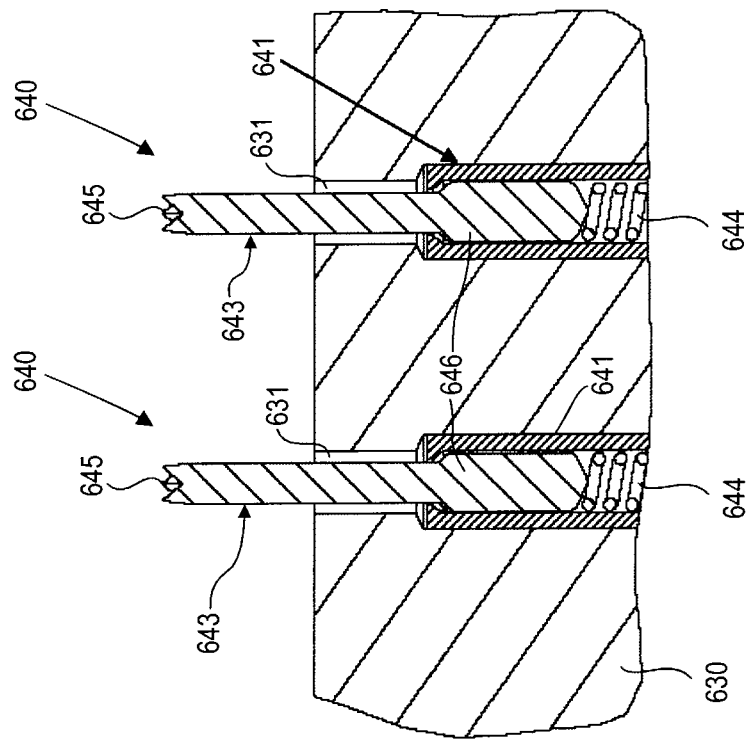
FIGS. 6 and 7 are cross-sectional views of an electrical connector, according to an exemplary embodiment.
Figure 6:
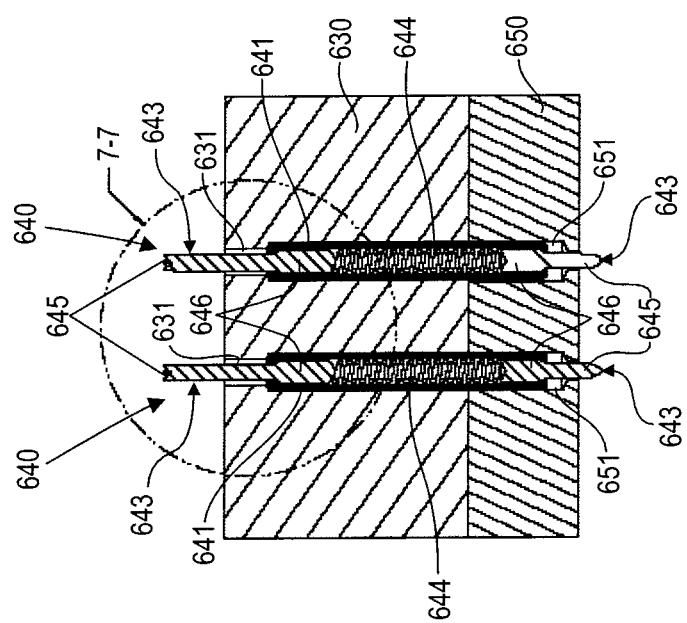

FIGS. 6 and 7 show an electrical connector, according to an exemplary embodiment. The electrical connector can be an interconnector configured to transmit electrical signals between various devices, such as between an IC chip and a PCB or motherboard. The electrical connectors disclosed herein can be used in a variety of applications, such as, but not limited to, electronics and semiconductor applications. For example, according to an exemplary embodiment, the electrical connector can be provided in a test system for testing an IC chip. In such a test system, the electrical connector can electrically connect the IC chip to a PCB used for testing the IC chip.

The electrical connector can include a socket body 630, one or more contact probes 640, and a retainer 650. Both the socket body 630 and the retainer 650 can be generally planar, e.g., can extend generally horizontally, and can be disposed adjacent to each other. For example, the socket body 630 can lie on top of the retainer 650, as shown in FIG. 6, or the retainer 650 can lie on top of the socket body 630.

The socket body 630 can include one or more socket cavities 631, and the retainer 650 can include one or more retainer cavities 651 aligned with the socket cavities 631. Contact probes 640 can be disposed in the respective socket cavities 631 and the corresponding retainer cavities 651. For example, in an embodiment in which the electrical connector electrically connects an IC chip to a PCB, each aligned pair of the socket cavity 631 and the retainer cavity 651 can be aligned with a corresponding pad on the IC chip and a corresponding pad on the PCB such that the contact probe 640 in the aligned pair of the socket cavity 631 and the retainer cavity 651 electrically connects the corresponding pads of the IC chip and PCB.

The number of contact probes 640 (and corresponding number of socket cavities 631 and retainer cavities 651) can depend, e.g., on the desired data rate, the structure of the IC chip, the PCB, or other device being electrically connected by the electrical connector, etc. For example, less than ten to over one thousand contact probes 640 can be provided.

The contact probe 640 can contact a shell layer 641, and can include a pair of plungers 643 and a biasing device 644. The shell layer 641 can be tubular and can be formed of a conductive material, such as a plating alloy, e.g., nickel and/or gold. The cross-section of the shell layer 641 can be circular, oval, square, rectangular, or other shape. The shell layer 641 can include multiple sections with different cross-sectional shapes and/or dimensions. The plungers 643 and the biasing device 644 can be slidable within the shell layer 641.

The plunger 643 can include a tip 645 at one end and a tail 646 at the opposite end. The shell layer 641 and/or the socket body 630 can include ends that capture the tails 646 and the biasing device 644 within the shell layer 641 and/or the socket body 630, and the ends of the shell layer 641 and/or the socket body 630 can include openings through which the tips 645 slide as the tail 646 slides within the shell layer 641. The tip 645 can be shaped to contact the corresponding pad on the device to be electrically connected to the electrical connector, e.g., the corresponding pad on the IC chip or PCB. The tail 646 can have a cross-section that is slidably received in the shell layer 641 with little or no gap between the external surface of the tail 646 and the internal surface of the shell layer 641.

The biasing device 644 can be a spring or other device capable of exerting a biasing force on one or both plungers 643 to bias the plunger(s) 643 outwardly from the shell layer 641. In the exemplary embodiment shown in FIGS. 6 and 7, a single biasing device 644 is provided for exerting biasing forces on both plungers 643. Alternatively, two biasing devices 644 can be provided for exerting biasing forces on the plungers 643 separately. The biasing device 644 can have a cross-section that is shaped to correspond to the shape of the internal surface of the shell layer 641.

The plunger tip 645 and the plunger tail 646 can be formed of an electrically conductive material to allow an electrical connection between the plungers 643 and the shell layer 641, e.g., between the IC chip and the PCB. Thus, in an exemplary embodiment, to assist in the electrical connection between the plunger tails 646 and the shell layer 644, the internal surface of shell layer 641 and the external surfaces of plunger tails 646 can be in contact such that there is no gap between these surfaces. For example, the plunger tail 646 can be formed with approximately the same cross-sectional shape and dimensions as the inner cross-section of the shell layer 644. Thus, at least a portion of the external surface of the plunger tail 646 can be isomorphic to the internal surface of the shell layer 644. The biasing device 644 can also be formed of an electrically conductive material and can also permit the electrical connection between the IC chip and the PCB.

The plungers 643 can be depressed inwardly (contract) into the shell layer 641 under a force directed inward against the biasing device 644. For example, in an embodiment in which the electrical connector electrically connects an IC chip to a PCB, the socket body 630, the shell layers 641, the contact probes 640, and the retainer 650 can be sandwiched between the IC chip and the PCB. In this configuration, the IC chip and the PCB can exert forces against the respective plunger tips 645 that cause the plungers 643 to be depressed inwardly into the shell layer 641. Thus, the plunger tips 645 on one end of the respective contact probes 640 contact the respective pads on the IC chip, and the plunger tips 645 on the opposite end of the respective contact probes 640 contact the respective pads on the PCB. The ability of the plungers 643 to expand and contract with respect to the shell layer 641 can compensate for dimension variation of the IC chip. Also, biasing the plungers 643 outward allows a more secure connection between the plungers 643 and the respective IC chip or PCB.

The shell layer 641 can be formed inside the socket cavity 631 such that at least a portion of an outer or external surface of the shell layer 641 is isomorphic to an internal surface of the socket cavity 631. In an exemplary embodiment, the shell layer 641 can be formed directly inside the socket cavity 631, as will be described below in detail. The contact probe 640 can also be assembled directly inside the socket cavity 631 of the socket body 630. Because the shell layer 641 and the contact probe 640 are not assembled separately from the socket body 630, there can be less risk of breaking the shell layer 641 and/or the contact probe 640 due to handling these components outside of the socket body 630. For example, as described below, it is not necessary to slide the shell layer 641 by itself into socket cavity 631, which can increase the risk of breaking or bending the shell layer 641.

FIGS. 8-14 depict a method for forming the electrical connector, according to an exemplary embodiment. As shown in FIG. 8, a core 800 can be formed. The core 800 can be formed of a material that is capable of being dissolved or removed chemically, such as by chemical etching, as will be described below. For example, the core 800 can be formed from an aluminum alloy. The core 800 can include a body portion 801, a shoulder portion 802, and a neck portion 803. The body portion 801 can have a larger cross-sectional area (e.g., a larger outer diameter) than the neck portion 803, and the shoulder portion 802 can form a transition between the body portion 801 and the neck portion 803, as shown in FIG. 8. Alternatively, the core 800 can have other shapes. For example, the shoulder portion 802 can be omitted, and the body portion 801 can transition directly to the neck portion 803.

As shown in FIG. 9, the socket cavity 631 can be formed in the socket body 630. The socket cavity 631 can extend entirely through the depth of the socket body 630, as shown in FIG. 9. The socket cavity 631 can include a body portion 932, a shoulder portion 933, and a neck portion 934. The body portion 932 can have a larger cross-sectional area (e.g., a larger inner diameter) than the neck portion 934, and the shoulder portion 933 can form a transition between the body portion 932 and the neck portion 934, as shown in FIG. 9. Alternatively, the socket cavity 631 can have other shapes. For example, the shoulder portion 933 can be omitted, and the body portion 932 can transition directly to the neck portion 934. The depth of the socket body 630, i.e., the dimension along which the socket cavity 631 extends, can be shorter than the length of the core 800.

As shown in FIG. 10, the core 800 can be affixed or coated with one or more layers. In the exemplary embodiment, the core 800 can be first coated with a first layer 1000 on substantially the entire external surface of the core 800 and then a second layer 1001 on substantially the entire external surface of the first layer 1000. Alternatively, the core 800 can be coated with a single layer or with more than two layers. Also, in the exemplary embodiment, the first layer 1000 can be plated onto the core 800 with a plating alloy, and the second layer 1001 can be plated onto the first layer 1000 with another plating alloy. For example, the first layer 1000 can be formed of gold and can have a thickness of approximately 0.5 um (micrometers or microns) to 3 um. The second layer 1001 can be formed of nickel and can have a thickness of approximately 3 um to 10 um or more. Alternatively, the first layer 1000 can be formed of nickel or other plating alloy, and the second layer 1001 can be formed of gold or other plating alloy. The plating alloy materials and thicknesses of the respective layers can be determined based on the particular application.

Next, as shown in FIG. 11, the core 800 with the layers 1000, 1001, as shown in FIG. 10, can be press fit into the socket cavity 631. For example, the core 800 with the layers 1000, 1001 can be press fit into the socket cavity 631 so that the external surfaces of the body portion 801, the shoulder portion 802, and the neck portion 803 of the core 800 with the layers 1000, 1001 are proximal to and contact the internal surfaces of the corresponding body portion 932, the shoulder portion 933, and the neck portion 934 of the socket cavity 631. As a result, the layers 1000, 1001 are press fit or compressed into the socket cavity 631, thereby affixing the external surface of the second layer 1001 to the internal surface of the socket cavity 631.

As shown in FIG. 11, the depth of the socket body 630 can be shorter than the length of the core 800 with the layers 1000, 1001 such that one or both of the ends of the core 800 and the layers 1000, 1001 extend outward from the socket body 630 when the core 800 with the layers 1000, 1001 is press fit into the socket cavity 631. FIG. 12 shows an optional step in which the ends of the core 800 and the layers 1000, 1001 that extend outward from the socket body 630 are removed. Any method for removing or cutting the ends of the core 800 and the layers 1000, 1001 can be used. As shown in FIG. 12, the ends of the core 800 and the layers 1000, 1001 can be removed such that the layers 1000, 1001 and the core 800 are flush with the ends of the socket body 630. As a result, the core 800 is exposed from at least one of the ends. This aspect of the method of FIGS. 8-14 may not be necessary in certain embodiments, for example, as will be described below in connection with FIGS. 16-21.

As shown in FIG. 13, the core 800 can be removed to form a socket shell 1300 having a shell cavity 1340. In the exemplary embodiment, after removing the ends of the core 800 and the layers 1000, 1001 to expose the ends of the core 800, the core 800 can be dissolved and/or removed chemically, for example, by chemical etching. During the chemical etching process, a chemical solvent can be applied to the core 800 (e.g., by immersing the socket body 630 in the chemical solvent) to remove the core 800 without removing the layers 1000, 1001 or the socket body 630. For example, in the exemplary embodiment, the chemical solvent can be a base solution, such as sodium hydroxide (NaOH) or other solution that removes the aluminum alloy or other material used to form the core 800, but does not remove the nickel, gold, or other plating alloy used to form the layers 1000, 1001 or the material used to form the socket body 630. Accordingly, after the core 800 is removed, the layers 1000, 1001 and the socket body 630 remain to form the socket shell 1300, and the internal surface of the first layer 1000 forms the shell cavity 1340 in the socket shell 1300.

The layers 1000, 1001 form the shell layer 641, which can be embedded in the socket body 630 and affixed to the internal surface of the socket cavity 631 due to the press fitting of the core 800 with the layers 1000, 1001 in the shell cavity 631 as described above in connection with FIG. 11. The entire external surface of the shell layer 641 (or a portion thereof) faces and is isomorphic to the internal surface of the socket cavity 631 in the socket body 630, and the external surface of the shell layer 641 (or a portion thereof) facing the socket cavity 631 and the corresponding internal surface of the socket cavity 631 can be in contact such that there is no gap between these surfaces.

As shown in FIG. 14, the plungers 643 and the biasing device 644 can be inserted into the socket cavity 1340, and the retainer 650 is inserted over the plunger tip 645. In the exemplary embodiment, a first plunger 643 is inserted so that the plunger tip 645 is inserted through the portion of the shell cavity 1340 formed by the socket cavity neck portion 934 and its plunger tail 646 is slidably disposed within the portion of the shell cavity 1340 formed by the socket cavity body portion 932. Then, the biasing device 644 and a second plunger 643 can be inserted into the shell cavity 1340. The biasing device 644 can be positioned between the respective plunger tails 646 of the two plungers 643, and the plunger tail 646 of the second plunger 642 is slidably disposed within the portion of the shell cavity 1340 formed by the socket cavity body portion 932. Next, the retainer 650 is positioned against the socket shell 1300 so that the plunger tip 645 of the second plunger 643 is inserted through the retainer cavity 651. The retainer 650 can serve to hold and limit the sliding movement of the plungers 643 and the biasing device 644 in the socket shell 1300. The plunger tail 646 of both plungers 643 can be formed so that at least a portion of the external surface thereof is isomorphic to the internal surface of the shell cavity 1340, and the external surface of the respective plunger tail 646 and the internal surface of the shell cavity 1340 can be in contact such that there is no gap between these surfaces.

As described above in connection with FIGS. 8 and 10, the core 800 can be machined individually and then plated with the first and second layers 1000, 1001. Alternatively, as shown in FIG. 15, the core 800 shown in FIG. 8 can be formed from a wire 1500. The wire 1500 can have a substantially constant cross-section and then can be stamped to form a connected series of the cores 800, each including the body portion 801, the shoulder portion 802, and the neck portion 803, as shown in FIG. 15. A core 800 can be cut off individually from the wire 1500 to form the core 800 shown in FIG. 8. The core 800 can further be plated with the first and the second layers 1000, 1001, as shown in FIG. 10.

Although FIGS. 9 and 11-14 show a single socket cavity 631 in the socket body 630, multiple socket cavities 631 can be formed in the single socket body 630. Multiple cores 800 can be formed and layered, similar to the embodiment described above in connection with FIGS. 8, 10, and 15, and press fit into respective socket cavities 631 of the single socket body 630, similar to the embodiment described above in connection with FIG. 11. There can be a one-to-one correspondence between each core 1600 and each socket cavity 631. The ends of the multiple cores 800 with the layers 1000, 1001 can be removed as described above in connection with FIG. 12, and the entire socket body 630 can be immersed in the chemical solvent. The chemical solvent can remove all cores 800 in the single socket body 630, similar to the embodiment described above in connection with FIG. 13, to form the socket shell 1300 with multiple shell cavities 1340. Then, one biasing device 644 and the pair of plungers 643 can be inserted into each shell cavity 1340 and a retainer 650 can be positioned against the socket shell 1300 so that the plunger tips 645 can be inserted through the respective retainer cavities 651 in the retainer 650, similar to the embodiment described above in connection with FIG. 14.

FIGS. 16-21 depict a method for forming the electrical connector, according to another exemplary embodiment. A core 1600 can be formed, as shown in FIG. 16. The core 1600 can be formed of a material that is capable of being dissolved or removed chemically, such as by chemical etching. For example, the core 1600 can be formed from an aluminum alloy. The core 1600 can have a constant cross-section, as shown in FIG. 16. For example, the cross-section of the core 1600 can be circular, oval, square, rectangular, etc. Alternatively, the core 1600 can have other shapes. The core 1600 can be formed to have a length that is approximately equal to the depth of the body portion 932 of the socket cavity 631, as shown in FIG. 16.

As shown in FIG. 17, the socket cavity 631 is formed in the socket body 630. The socket cavity 631 can be formed in the socket body 630 as described above in connection with FIG. 9. In the exemplary embodiment shown in FIGS. 16-21, the depth of the socket body 630, i.e., the dimension along which the socket cavity 631 extends, can be longer than the length of the core 1600, as described below.

As shown in FIG. 18, the core 1600 can be affixed or coated with one or more layers. In the exemplary embodiment, the external side surface, i.e., the external surface that faces the internal surface of the socket cavity 631, of the core 1600 can be coated. The core 1600 can be first coated with a first layer 1800 and then with a second layer 1801. Alternatively, the core 1600 can be coated with a single layer or with more than two layers. Also, in the exemplary embodiment, the first layer 1800 can be plated onto the core 1600 with a plating alloy, and the second layer 1801 can be plated onto the first layer 1800 with another plating alloy. For example, the first layer 1800 can be formed of gold and can have a thickness of approximately 0.5 um to 3 um. The second layer 1801 can be formed of nickel and can have a thickness of approximately 3 um to 10 um or more. Alternatively, the first layer 1800 can be formed of nickel or other plating alloy, and the second layer 1801 can be formed of gold or other plating alloy. The plating alloy materials and thicknesses of the respective layers can be determined based on the particular application.

As shown in FIG. 19, the core 1600 with the layers 1800, 1801, as shown in FIG. 18, can be press fit into the socket cavity 631. For example, the core 1600 with the layers 1800, 1801 can be press fit into the socket cavity 631 so that the external surface of the second layer 1801 is proximal to and contacts the internal surface of body portion 932 of the socket cavity 631. Since the depth of the socket body 630 is longer than the length of the core 1600 with the layers 1800, 1801 and since the ends of the core 1600 are exposed (not covered by the layers 1800, 1801), it is not necessary to remove the ends of the core 1600 and the layers 1800, 1801, as described in connection with FIG. 12. As a result, the layers 1800, 1801 are press fit or compressed into the socket cavity 631, thereby affixing the external surface of the second layer 1801 to the internal surface of the socket cavity 631.

As shown in FIG. 20, the core 1600 can be removed to form a socket shell 2000 having a shell cavity 2040. In the exemplary embodiment, the core 1600 can be dissolved and/or removed chemically, for example, by chemical etching. During the chemical etching process, a chemical solvent can be applied to the core 1600 (e.g., by immersing the socket body 630 in the chemical solvent) to remove the core 1600 without removing the layers 1800, 1801 or the socket body 630. For example, in the exemplary embodiment, the chemical solvent can be a base solution, such as sodium hydroxide (NaOH) or other solution that removes the aluminum alloy or other material used to form the core 1600, but does not remove the nickel, gold, or other plating alloy used to form the layers 1800, 1801 or the material used to form the socket body 630. Accordingly, after the core 1600 is removed, the layers 1800, 1801 and the socket body 630 remain to form the socket shell 2000, and the internal surface of the first layer 1800 forms the shell cavity 2040 in the socket shell 2000.

The layers 1000, 1001 form the shell layer 641, which can be embedded in the socket body 630 and affixed to the internal surface of the socket cavity 631 due to the press fitting of the core 1600 with the layers 1000, 1001 into the shell cavity 631 as described above in connection with FIG. 19. The entire external surface of the shell layer 641 (or a portion thereof) faces and is isomorphic to the internal surface of the socket cavity 631 in the socket body 630, and the external surface of the shell layer 641 (or a portion thereof) facing the socket cavity 631 and the corresponding internal surface of the socket cavity 631 can be in contact such that there is no gap between these surfaces.

As shown in FIG. 21, the plungers 643 and the biasing device 644 can be inserted into the socket cavity 2040, and the retainer 650 is inserted over the plunger tip 645. In the exemplary embodiment, a first plunger 643 is inserted so that its plunger tip 645 is inserted through the portion of the shell cavity 2040 formed by the socket cavity neck portion 934 and the plunger tail 646 is slidably disposed within the portion of the shell cavity 1340 formed by the socket cavity body portion 932. Then, the biasing device 644 and a second plunger 643 can be inserted into the shell cavity 2040. The biasing device 644 can be positioned between the respective plunger tails 646 of the two plungers 643, and the plunger tail 646 of the second plunger 642 is slidably disposed within the portion of the shell cavity 2040 formed by the socket cavity body portion 932. Next, the retainer 650 is positioned against the socket shell 2000 so that the plunger tip 645 of the second plunger 643 is inserted through the retainer cavity 651. The retainer 650 can serve to hold and limit the sliding movement of the plungers 643 and the biasing device 644 in the socket shell 2000. The plunger tail 646 of both plungers 643 can be formed so that at least a portion of the external surface thereof is isomorphic to the internal surface of the shell cavity 2040, and the external surface of the respective plunger tail 646 and the internal surface of the shell cavity 2040 can be in contact such that there is no gap between these surfaces.

Figure 22:
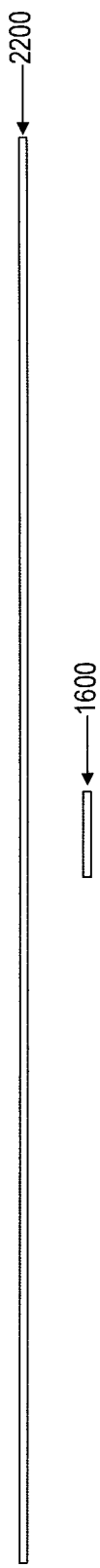
FIG. 22 is a side view of a wire for forming the core of FIG. 16.

As described above in connection with FIGS. 16 and 18, the core 1600 can be machined individually and then individually plated with the first and the second layers 1800, 1801. Alternatively, as shown in FIG. 22, the core 1600 shown in FIG. 16 can be formed from a wire 2200. The wire 2200 can have a substantially constant-cross section. A core 1600 can be cut off individually from the wire 2200, e.g., to form the cores 1600 of a predetermined length, such as the core 1600 shown in FIG. 16. Then, after cutting the core 1600 from the wire 2200, the core 1600 can be plated with the first and the second layers 1800, 1801, as shown in FIG. 18. Alternatively, the wire 2200 can be plated with the first and the second layers 1800, 1801 prior to cutting the cores 1600 from the wire 2200. When the wire 2200 is plated prior to cutting the cores 1600 from the wire 2200, the step of plating the core 1600 individually as shown in FIG. 18 can be omitted.

Although FIGS. 17 and 19-21 show a single socket cavity 631 in the socket body 630, multiple socket cavities 631 can be formed in the single socket body 630. The multiple cores 1600 can be formed and layered, similar to the embodiment described above in connection with FIGS. 16, 18, and 22, and press fit into respective socket cavities 631 of the single socket body 630, similar to the embodiment described above in connection with FIG. 19. There can be a one-to-one correspondence between each core 1600 and each socket cavity 631. The entire socket body 630 can be immersed in the chemical solvent. The chemical solvent can remove all cores 1600 in the single socket body 630, similar to the embodiment described above in connection with FIG. 20, to form the socket shell 2000 with the multiple shell cavities 2040. Then, one biasing device 644 and the pair of plungers 643 can be inserted into each shell cavity 2040 and a retainer 650 can be positioned against the socket shell 2000 so that the plunger tips 645 can be inserted through the respective retainer cavities 651 in the retainer 650, similar to the embodiment described above in connection with FIG. 21.

As described above, the core 800 (or 1600) can be used to form the socket shell 1300 (or 2000). The core 800 (or 1600) can be formed to be strong enough to withstand the forces exerted on it, such as the compression on the core 800 (or 1600) as it is inserted into the socket cavity 631. For example, the core 800 (or 1600) can be formed of a particular material and/or with a particular shape to ensure that it is strong enough to withstand the forces, and that is also capable of being chemically removed.

By press fitting or compressing the core 800 (or 1600) with the layers 1000, 1001 (or 1800, 1801) into the socket cavity 631, the socket shell 1300 (or 2000) can be formed without a gap and/or with a tight fit between the socket body 630 and the embedded shell layer 641 formed by the layers 1000, 1001 (or 1800, 1801). At least a portion of the external surface of the shell layer 641 can be isomorphic to the internal surface of the socket cavity 631. As a result, the risk of deforming the shell layer 641 and/or the contact probe 640 (formed by the plungers 643 and the biasing device 644) as they are inserted into and supported by the socket body 630 is reduced.

Also, since the shell layer 641 can be formed directly in the socket body 630, as described above, certain steps that are typically performed when forming conventional spring probes can be avoided, such as having to crimp the ends of the shell of each contact probe.

It will be apparent to those skilled in the art that various modifications and variations can be made in the disclosed systems and processes without departing from the scope of the disclosure. That is, other embodiments will be apparent to those skilled in the art from consideration of the specification and practice of the disclosure. It is intended that the specification and examples be considered as exemplary only, with a true scope being indicated by the following claims and their equivalents.

What is claimed is:

1. An electrical connector comprising:
    a socket shell comprising a body having a socket cavity with an internal socket surface extending through the body, and at least one shell layer having a shell cavity and an external shell surface isomorphic to at least a portion of the internal socket surface and affixed as a layer to at least said portion of the internal socket surface, the at least one shell layer comprising a first shell material, the at least one shell layer being press fit into the socket cavity to affix the at least one shell layer to the portion of the internal socket surface; and
    a contact probe comprising:
        at least one plunger slidably received in the shell cavity and extending through a first opening in a first end of the shell cavity, and
        a biasing device configured to exert a biasing force on the at least one plunger.

2. The electrical connector of claim 1, wherein the first shell material is selected from at least one of: gold and nickel.

3. The electrical connector of claim 1, further comprising:
a retainer contacting the socket shell and configured to limit slidable movement of at least one of: the at least one plunger and the biasing device within the shell cavity.

4. The electrical connector of claim 1, further comprising:
a plurality of contact probes;
wherein the body comprises a plurality of socket cavities, each associated with at least one of the plurality of contact probes.

5. The electrical connector of claim 1, wherein:
the internal socket surface includes a body portion and a neck portion, the neck portion of the internal socket surface having a smaller cross-section than the body portion of the internal socket surface;
the external shell surface includes a body portion and a neck portion, the neck portion of the external shell surface being isomorphic to the neck portion of the internal socket surface, and the body portion of the external shell surface being isomorphic to the body portion of the internal socket surface; and
the body portion of the external shell surface is affixed as a layer to said body portion of the internal socket surface, and the neck portion of the external shell surface is affixed as a layer to said neck portion of the internal socket surface.

6. The electrical connector of claim 5, further comprising,
the internal socket surface includes a shoulder portion connecting the body portion of the internal socket surface and the neck portion of the internal socket surface;
the external shell surface includes a shoulder portion connecting the body portion of the external shell surface and the neck portion of the external shell surface; and
the shoulder portion of the external shell surface is affixed as a layer to said shoulder portion of the internal socket surface.

7. The electrical connector of claim 1, wherein:
the at least one plunger includes a first plunger that extends through the first opening in the first end of the shell cavity and a second plunger that extends through a second opening in a second end of the shell cavity; and
the biasing device is configured to exert the biasing force on the first and second plungers so that the first and second plungers are biased away from each other.

8. The electrical connector of claim 7, wherein:
the electrical connector is an interconnector configured to electrically connect an integrated circuit chip to a printed circuit board via the contact probe;
the first plunger is configured to electrically connect to the integrated circuit chip; and
the second plunger is configured to electrically connect to the printed circuit board.

9. The electrical connector of claim 1, wherein the electrical connector is an interconnector configured to electrically connect an integrated circuit chip to a printed circuit board via the contact probe.

10. The electrical connector of claim 9, wherein the at least one plunger includes a tail that is slidably received in the shell cavity and a tip configured to contact one of the integrated circuit chip and the printed circuit board to form an electrical connection.

11. The electrical connector of claim 1, wherein the biasing device is a spring.

12. The electrical connector of claim 1, wherein the at least one plunger including a tail slidably received in and contacting the at least one shell layer.

13. The electrical connector of claim 1, wherein the at least one shell layer includes:
a first layer formed of the first shell material, the first layer being isomorphic to at least the portion of the internal socket surface and affixed as a layer to at least the portion of the internal socket surface; and
a second layer formed of a second shell material and contacting an internal surface of the first layer, the second shell material being different from the first shell material.

14. The electrical connector of claim 1, wherein the at least one shell layer has a substantially constant cross-section along a length of the socket cavity.

15. The electrical connector of claim 4, wherein each contact probe provides an electrical connection between an integrated circuit chip and a printed circuit board that is separate from the electrical connections between the integrated circuit chip and the printed circuit board provided by other contact probes.

16. An electrical connector comprising:
a socket shell comprising a body having a socket cavity with an internal socket surface extending through the body, and at least one shell layer having a shell cavity and an external shell surface isomorphic to at least a portion of the internal socket surface and affixed as a layer to at least said portion of the internal socket surface, the at least one shell layer comprising a first shell material; and
a contact probe comprising:
at least one plunger slidably received in the shell cavity and extending through a first opening in a first end of the shell cavity, the at least one plunger including a tail slidably received in and contacting the at least one shell layer, and
a biasing device configured to exert a biasing force on the at least one plunger.

17. The electrical connector of claim 16, further comprising:
a retainer contacting the socket shell and configured to limit slidable movement of the at least one plunger, the biasing device being configured to exert the biasing force on the at least one plunger to position the tail of the at least one plunger so that the tail contacts the retainer and the at least one shell layer.

18. A method of forming an electrical connector, the method comprising:
affixing at least one layer to a core such that the at least one layer is isomorphic to at least a portion of an external surface of the core;
inserting the core with the at least one layer into a socket cavity in a socket body of a socket shell, where the socket cavity comprises an internal socket surface extending through the body;
removing the core from the socket cavity while leaving at least a portion of the at least one layer so that the at least one layer forms at least one shell layer affixed to the internal socket surface of the socket cavity, the at least one shell layer further comprising a shell cavity with an external shell surface isomorphic to at least a portion of the internal socket surface and affixed as a layer to at least the portion of the internal socket surface, the at least one shell layer comprising a first shell material; and
inserting at least one plunger and a biasing device into the shell cavity so that the at least one plunger is slidably received in the shell cavity and extends through a first opening in a first end of the shell cavity, so that the biasing device exerts a biasing force on the at least one plunger, and so that a tail of the at least one plunger is slidably received in and contacts the at least one shell layer, the at least one plunger and the biasing device forming a contact probe.

19. The method of claim 18, further comprising at least partially closing an open end of the shell cavity using a retainer to limit sliding movement of at least one of the at least one plunger and the biasing device in the shell cavity, the retainer contacting the socket shell and limiting slidable movement of the at least one plunger, the biasing device being configured to exert the biasing force on the at least one plunger to position the tail of the at least one plunger so that the tail contacts the retainer and the at least one shell layer.

\* \* \* \* \*